(12) United States Patent
Howard

(10) Patent No.: US 7,860,910 B2
(45) Date of Patent: Dec. 28, 2010

(54) SYSTEM AND METHOD FOR MAPPING MATHEMATICAL FINITE FLOATING-POINT NUMBERS

(76) Inventor: Robert S. Howard, 510 W. Almeria Rd., Phoenix, AZ (US) 85003

( * ) Notice: Subject to any disclaimer, the term of this patent is extended or adjusted under 35 U.S.C. 154(b) by 1217 days.

(21) Appl. No.: 11/282,735

(22) Filed: Nov. 17, 2005

(65) Prior Publication Data

US 2006/0106909 A1 May 18, 2006

Related U.S. Application Data

(60) Provisional application No. 60/629,128, filed on Nov. 17, 2004.

(51) Int. Cl.
*G06F 15/00* (2006.01)
(52) U.S. Cl. .................................................. 708/204
(58) Field of Classification Search .................. 708/204
See application file for complete search history.

(56) References Cited

U.S. PATENT DOCUMENTS

| 5,038,309 | A | 8/1991 | Priem et al. |
|---|---|---|---|
| 5,825,678 | A | 10/1998 | Smith |
| 6,510,446 | B1 * | 1/2003 | Fukagawa .................. 708/497 |
| 6,829,627 | B2 | 12/2004 | Krygowski et al. |
| 7,139,005 | B2 * | 11/2006 | Wang et al. .................. 345/643 |
| 7,627,040 | B2 * | 12/2009 | Woods et al. ........... 375/240.26 |
| 7,653,133 | B2 * | 1/2010 | Woods et al. ........... 375/240.13 |
| 2007/0220023 | A1 * | 9/2007 | Dean et al. .................. 707/101 |

\* cited by examiner

*Primary Examiner*—Tan V Mai
(74) *Attorney, Agent, or Firm*—Robert D. Atkins

(57) ABSTRACT

A floating-point number is encoded into a binary string. A left-to-right comparison of the binary string determines relative magnitude of the floating-point number. If the floating-point number is negative, then take an absolute value of the floating-point number. The resulting binary string conversion is then complemented. If the floating-point number is zero, then a value for the binary string is assigned. The value is a "1" followed by a plurality of "0"s. A portion of each byte of the binary string determines whether another byte follows in the binary string. A value of a bit of each byte of the binary string determines whether another byte follows. In another aspect, the floating-point number encodes to a binary string having a length as a function of the mantissa and exponent of the floating-point number.

11 Claims, 9 Drawing Sheets

|  | SINGLE | DOUBLE | EXTENDED |
|---|---|---|---|
| TOTAL BITS | 32 | 64 | 80 |
| EXPONENT BITS | 8 | 11 | 15 |
| SMALLEST EXPONENT | −126 | −1022 | −16383 |
| LARGEST EXPONENT | +127 | +1023 | +16383 |
| MANTISSA BITS | 24 | 53 | 64 |
| SMALLEST POSITIVE VALUE | 1.4012985e−45 | 2.4703282292062327e−324 | 1.8225997659412373 0126e−4951 |
| LARGEST POSITIVE VALUE | 3.4028235e+38 | 1.7976931348623157e+308 | 1.1897314953572317 6502e+4932 |

|  | QUADRUPLE | BROOKSHEAR | INVENTION |
|---|---|---|---|
| TOTAL BITS | 128 | 8 | ANY MULTIPLE OF 8 |
| EXPONENT BITS | 15 | 3 | 2, 6, 12, 28, … |
| SMALLEST EXPONENT | −16382 | −3 | ANY |
| LARGEST EXPONENT | +16383 | +4 | ANY |
| MANTISSA BITS | 112 | 4 | ANY |
| SMALLEST POSITIVE VALUE | 1.82259976594123730126e−4951 | 3.90625e−3 | ANY |
| LARGEST POSITIVE VALUE | 1.18973149535723176502e+4932 | 7.5 | ANY |

FIG. 1

| ENCODING METHOD | BYTE COUNT | BIT FORMAT (S)IGN, (E)XPONENT, (M)ANTISSA |
|---|---|---|
| BROOKSHEAR | 1 | SEEEMMMM |
| SINGLE | 4 | SEEEEEEE EMMMMMMM MMMMMMMM MMMMMMMM |
| DOUBLE | 8 | SEEEEEEE EEEEMMMM MMMMMMMM MMMMMMMM MMMMMMMM MMMMMMMM MMMMMMMM MMMMMMMM |
| EXTENDED | 10 | SEEEEEEE EEEEEEEE MMMMMMMM MMMMMMMM MMMMMMMM MMMMMMMM MMMMMMMM MMMMMMMM MMMMMMMM MMMMMMMM |
| QUADRUPLE | 16 | SEEEEEEE EEEEEEEE MMMMMMMM MMMMMMMM MMMMMMMM MMMMMMMM MMMMMMMM MMMMMMMM MMMMMMMM MMMMMMMM MMMMMMMM MMMMMMMM MMMMMMMM MMMMMMMM MMMMMMMM MMMMMMMM |

| ROW | HEXDECIMAL BYTES 00 01 02 03 | CORRESPONDING BITS 00000000 11111111 22222222 33333333 01234567 01234567 01234567 01234567 | CORRESPONDING IEEE 754 NUMERIC VALUE |
|---|---|---|---|
| 1 | C0 00 00 00 | 11000000 00000000 00000000 00000000 | -2 |
| 2 | 00 00 00 00 | 00000000 00000000 00000000 00000000 | 0 |
| 3 | 3F C0 00 00 | 00111111 11000000 00000000 00000000 | 1.5 |
| 4 | 40 00 00 00 | 01000000 00000000 00000000 00000000 | 2 |

FIG. 3

| | PROPERTIES | | | BIT PATTERN | | | | | | | |
|---|---|---|---|---|---|---|---|---|---|---|---|
| ROW | E | M | MAX EXP. | DIGITS | BYTE 0 | BYTE 1 | BYTE 2 | BYTE 3 | BYTE 4 | BYTE 5 | BYTE 6 | BYTE 7 |
| 1 | 2 | 3 | 0.790203739 | 0.90 | SZEEMMM0 | | | | | | | |
| 2 | 2 | 10 | 0.790203739 | 3.01 | SZEEMMM1 | MMMMMMM0 | | | | | | |
| 3 | 2 | 17 | 0.790203739 | 5.12 | SZEEMMM1 | MMMMMMM1 | MMMMMMM0 | | | | | |
| 4 | 2 | 24 | 0.790203739 | 7.22 | SZEEMMM1 | MMMMMMM1 | MMMMMMM1 | MMMMMMM0 | | | | |
| 5 | 2 | 31 | 0.790203739 | 9.33 | SZEEMMM1 | MMMMMMM1 | MMMMMMM1 | MMMMMMM1 | MMMMMMM0 | | | |
| 6 | 2 | 38 | 0.790203739 | 11.44 | SZEEMMM1 | MMMMMMM1 | MMMMMMM1 | MMMMMMM1 | MMMMMMM1 | MMMMMMM0 | | |
| 7 | 2 | 45 | 0.790203739 | 13.55 | SZEEMMM1 | MMMMMMM1 | MMMMMMM1 | MMMMMMM1 | MMMMMMM1 | MMMMMMM1 | MMMMMMM0 | |
| 8 | 2 | 52 | 0.790203739 | 15.65 | SZEEMMM1 | MMMMMMM1 | MMMMMMM1 | MMMMMMM1 | MMMMMMM1 | MMMMMMM1 | MMMMMMM1 | MMMMMMM0 |
| 9 | 6 | 4 | 18.81672653 | 1.20 | SZ11EEE1 | EEEMMMM0 | | | | | | |
| 10 | 6 | 11 | 18.81672653 | 3.31 | SZ11EEE1 | EEEMMMM1 | MMMMMMM0 | | | | | |
| 11 | 6 | 18 | 18.81672653 | 5.42 | SZ11EEE1 | EEEMMMM1 | MMMMMMM1 | MMMMMMM0 | | | | |
| 12 | 6 | 25 | 18.81672653 | 7.53 | SZ11EEE1 | EEEMMMM1 | MMMMMMM1 | MMMMMMM1 | MMMMMMM0 | | | |
| 13 | 6 | 32 | 18.81672653 | 9.63 | SZ11EEE1 | EEEMMMM1 | MMMMMMM1 | MMMMMMM1 | MMMMMMM1 | MMMMMMM0 | | |
| 14 | 6 | 39 | 18.81672653 | 11.74 | SZ11EEE1 | EEEMMMM1 | MMMMMMM1 | MMMMMMM1 | MMMMMMM1 | MMMMMMM1 | MMMMMMM0 | |
| 15 | 6 | 46 | 18.81672653 | 13.85 | SZ11EEE1 | EEEMMMM1 | MMMMMMM1 | MMMMMMM1 | MMMMMMM1 | MMMMMMM1 | MMMMMMM1 | MMMMMMM0 |
| 16 | 12 | 7 | 1232.567354 | 2.11 | SZ111111 | 1IEEEEE1 | EEEEEEE1 | MMMMMMM0 | | | | |
| 17 | 12 | 14 | 1232.567354 | 4.21 | SZ111111 | 1IEEEEE1 | EEEEEEE1 | MMMMMMM1 | MMMMMMM0 | | | |
| 18 | 12 | 21 | 1232.567354 | 6.32 | SZ111111 | 1IEEEEE1 | EEEEEEE1 | MMMMMMM1 | MMMMMMM1 | MMMMMMM0 | | |
| 19 | 12 | 28 | 1232.567354 | 8.43 | SZ111111 | 1IEEEEE1 | EEEEEEE1 | MMMMMMM1 | MMMMMMM1 | MMMMMMM1 | MMMMMMM0 | |
| 20 | 12 | 35 | 1232.567354 | 10.54 | SZ111111 | 1IEEEEE1 | EEEEEEE1 | MMMMMMM1 | MMMMMMM1 | MMMMMMM1 | MMMMMMM1 | MMMMMMM0 |
| 21 | 28 | 0 | 80807123.7 | 0.00 | SZ111111 | 11111111 | EEEEEEE1 | EEEEEEE1 | EEEEEEE1 | EEEEEEE1 | EEEEEEE0 | |
| 22 | 28 | 7 | 80807123.7 | 2.11 | SZ111111 | 11111111 | EEEEEEE1 | EEEEEEE1 | EEEEEEE1 | EEEEEEE1 | EEEEEEE1 | MMMMMMM0 |

| BINARY | DECIMAL | BINARY | DECIMAL | BINARY | DECIMAL | BINARY | DECIMAL |
|---|---|---|---|---|---|---|---|
| 00010001 | -7.5 | 00111111 | -1 | 10000000 | 0 | 11010000 | 2 |
| 00010011 | -7 | 01010001 | -0.9375 | 10010000 | 0.25 | 11010010 | 2.25 |
| 00010101 | -6.5 | 01010011 | -0.875 | 10010010 | 0.28125 | 11010100 | 2.5 |
| 00010111 | -6 | 01010101 | -0.8125 | 10010100 | 0.3125 | 11010110 | 2.75 |
| 00011001 | -5.5 | 01010111 | -0.75 | 10010110 | 0.34375 | 11011000 | 3 |
| 00011011 | -5 | 01011001 | -0.6875 | 10011000 | 0.375 | 11011010 | 3.25 |
| 00011101 | -4.5 | 01011011 | -0.625 | 10011010 | 0.40625 | 11011100 | 3.5 |
| 00011111 | -4 | 01011101 | -0.5625 | 10011100 | 0.4375 | 11011110 | 3.75 |
| 00100001 | -3.75 | 01011111 | -0.5 | 10011110 | 0.46875 | 11100000 | 4 |
| 00100011 | -3.5 | 01100001 | -0.46875 | 10100000 | 0.5 | 11100010 | 4.5 |
| 00100101 | -3.25 | 01100011 | -0.4375 | 10100010 | 0.5625 | 11100100 | 5 |
| 00100111 | -3 | 01100101 | -0.40625 | 10100100 | 0.625 | 11100110 | 5.5 |
| 00101001 | -2.75 | 01100111 | -0.375 | 10100110 | 0.6875 | 11101000 | 6 |
| 00101011 | -2.5 | 01101001 | -0.34375 | 10101000 | 0.75 | 11101010 | 6.5 |
| 00101101 | -2.25 | 01101011 | -0.3125 | 10101010 | 0.8125 | 11101100 | 7 |
| 00101111 | -2 | 01101101 | -0.28125 | 10101100 | 0.875 | 11101110 | 7.5 |
| 00110001 | -1.875 | 01101111 | -0.25 | 10101110 | 0.9375 | | |
| 00110011 | -1.75 | | | 11000000 | 1 | | |
| 00110101 | -1.625 | | | 11000010 | 1.125 | | |
| 00110111 | -1.5 | | | 11000100 | 1.25 | | |
| 00111001 | -1.375 | | | 11000110 | 1.375 | | |
| 00111011 | -1.25 | | | 11001000 | 1.5 | | |
| 00111101 | -1.125 | | | 11001010 | 1.625 | | |
| | | | | 11001100 | 1.75 | | |
| | | | | 11001110 | 1.875 | | |

| DECIMAL | HEXADECIMAL | BINARY |
|---|---|---|
| 0 | 80 | 10000000 |
| 1 | C0 | 11000000 |
| 2 | D0 | 11010000 |
| 10 | F1 08 | 11110001 00001000 |
| 100 | F1 72 | 11110001 01110010 |
| 1000 | F1 DF 40 | 11110001 11011111 01000000 |
| -1000 | 0E 20 BF | 00001110 00100000 10111111 |
| 1024 | F1 E0 | 11110001 11100000 |
| -1024 | 0E 1F | 00001110 00011111 |
| 1234567.89 | F5 25 D7 43<br>F9 7B 71 51<br>F4 | 11110101 00100101 11010111 01000011<br>11111001 01111011 01110001 01010001<br>11110100 |
| -2.0125 | 2E F2 98 CC<br>66 32 98 CB | 00101110 11110010 10011000 11001100<br>01100110 00110010 10011000 11001011 |
| -2.125 | 2E 7F | 00101110 01111111 |
| 2.125 | D1 80 | 11010001 10000000 |

FIG. 8

| DATE/TIME | 1 JANUARY -4713 12:00:00 PM |
|---|---|
| FLOATING-POINT | 0 |
| HEXADECIMAL | 80 |
| BINARY | 10000000 |

| DATE/TIME | 31 DECEMBER -4713 |
|---|---|
| FLOATING-POINT | 365 |
| HEXADECIMAL | F1 AD D0 |
| BINARY | 11110001 10101101 11010000 |

| DATE/TIME | 22 DECEMBER -4714 |
|---|---|
| FLOATING-POINT | -10 |
| HEXADECIMAL | 0E F7 |
| BINARY | 00001110 11110111 |

| DATE/TIME | 24 JANUARY 1964 |
|---|---|
| FLOATING-POINT | 2438418.5 |
| HEXADECIMAL | F5 45 9B 45 50 |
| BINARY | 11110101 01000101 10011011 01000101 01010000 |

| DATE/TIME | 02 JANUARY 2003 4:45:33 |
|---|---|
| FLOATING-POINT | 2452641.69829861 |
| HEXADECIMAL | F5 45 B7 29 37 2D 1D CB 38 |
| BINARY | 11110101 01000101 10110111 00101001 00110111 00101101 00011101 11001011 00111000 |

| DATE/TIME | 14:45:47 |
|---|---|
| FLOATING-POINT | 0.12345678 |
| HEXADECIMAL | 8F DF 9B 6F 45 13 1D 45 54 |
| BINARY | 10001111 11011111 10011011 01101111 01000101 00010011 00011101 01000101 01010100 |

| DATE/TIME | 05 NOVEMBER 1843 |
|---|---|
| FLOATING-POINT | 1048576 |
| HEXADECIMAL | F5 20 |
| BINARY | 11110101 00100000 |

| DATE/TIME | 18:00:00 |
|---|---|
| FLOATING-POINT | 0.25 |
| HEXADECIMAL | 90 |
| BINARY | 10010000 |

90 ⟶ FIG. 9

SYSTEM AND METHOD FOR MAPPING MATHEMATICAL FINITE FLOATING-POINT NUMBERS

CLAIM TO DOMESTIC PRIORITY

The present invention claims priority to provisional patent application 60/629,128, filed Nov. 17, 2004, entitled "Method of Mapping any Mathematical Finite Floating-Point to an Array of One or More Bytes".

FIELD OF THE INVENTION

The present invention relates in general to digitally encoding and decoding numbers and, more particularly, to a system and method of encoding floating-point numbers as a binary string.

BACKGROUND OF THE INVENTION

Binary digital computers have long been used to store and process numbers, such as integers and floating-point numbers. Most if not all modern computer languages have provisions for manipulating numbers of one sort or another. Computers are essential to managing large amounts of numbers in an efficient and meaningful manner. While analog computers operate on continuous numbers, such as the real number domain, digital computers operate on discrete, countable numbers, such as the integers and rational numbers, and must approximate all others. Although some special-purpose analog computers may still be used in real-time products, such as those used in the aerospace industry, most business and personal computers in use today are digital, and are based on a binary system encoded representation of numbers using "bits". Most if not all modern computers partition their bits into groupings or packets of eight bits called "bytes".

Numbers have many classifications. The "Natural" numbers are 1, 2, 3, 4, 5, etc. The "Whole" numbers are 0, 1, 2, 3, 4, 5, etc. The whole numbers include all the natural numbers. The "Integer" numbers consist of the whole numbers and their negative values as well; i.e., 0, 1, −1, 2, −2, 3, −3, etc. The integer numbers include all the whole numbers. The "Rational" numbers are those numbers that occur when an integer number is divided by a whole number, such as 0, 1, −2, $\frac{2}{5}$, $-\frac{3}{4}$, $\frac{22}{7}$, etc. The rational numbers include all of the integer numbers. The "Irrational" numbers are those numbers that cannot be expressed by dividing an integer number by a whole number. Together, the rational numbers and the irrational numbers make up the set of "Real" numbers.

Floating-point numbering is a notation, convention, or system for depicting numbers. A floating-point number is really two integers separated by a decimal point, such as 123.45, 555.0, and 0.00627. The integer to the left of the decimal point is called the "integral part" of the floating-point number, and the integer to the right of the decimal point is called the "fractional part" of the floating-point number. All floating-point numbers are rational numbers, but only some rational numbers can be depicted as floating-point numbers. For example, the rational number $\frac{5}{4}$ is equivalent to the floating-point number 1.25. The rational number $\frac{4}{3}$ has no floating-point notation; however, the ellipses of 1.333333 . . . are often used to denote that the 3s repeat forever. However, digital computers have finite memory, and consequently can only store a finite number of floating-point digits. The finite limit constrains the representation of such numbers to an approximation, applies to many rational numbers, and certainly to all of the irrational numbers.

Digital computers are limited to the computation of discrete structures, such as the integers. By storing two integers together, the integer numerator and the whole denominator, the rational numbers can be completely modeled. However, this strategy is seldom practiced. Instead, floating-point numbers are used because more digits can be packed into the bytes of a floating-point number than can for two integers. Also, two floating-point numbers can be compared without requiring a division operation. A set of floating-point numbers can be sorted and grouped efficiently, a task which is ideal for digital computers.

Ultimately, numbers modeled in digital computers must be mapped to a field of bits, a process called "encoding". There have been many proposed and implemented methods for encoding integers and floating-point numbers. The most popular method for encoding integers is called the 2's complement method, and is used in the Intel Pentium® processor. In this method, the left-most bit is "1" for negative integers and "0" for all others. The industry standard method of encoding floating-point numbers is the IEEE 754 single- and double-precision format.

The IEEE 754 encoding method has been designed to optimize certain design constraints. In the IEEE 754 encoding method, a fixed-number of bytes is allocated. For example, the single-precision method encodes all floating-point numbers into four bytes. The double-precision method encodes all numbers into eight bytes. The left-most bit denotes the sign of the number. When all bytes in the encoding are zero, the floating-point number represents zero. It logically follows that the sign-bit is "1" for negative numbers, and "0" for all others. Every bit combination has a proper interpretation, which efficiently encodes as many numbers as possible into a fixed number of bytes. Some bit patterns encode special values, such as positive infinity, negative infinity, and NaN (Not A Number). The encodings have been optimized for arithmetic logic units (ALU) and other mathematical processors. The encoding methods partition the bits into three groups: the sign (S) bit, the mantissa (or precision) (M) bits, and the exponent (E) bits. For example, the four-byte single-precision encoding method partitions its 32-bits as SEEEEEEEE EMMMMMMM MMMMMMMM MMMMMMMM, i.e., one sign bit followed 8 exponent bits followed by 23 mantissa bits. Some bit patterns in these encoding methods can represent the same number. For instance, 00000000 00000000 00000000 00000000 represents zero. But change the left-most sign bit to "1", and the result is negative zero, which is the same value as positive zero. In addition, when floating-point numbers get very close to zero, such as 1.234567e-30, a different encoding method, called de-normalization, is used to minimize the loss of significant digits while keeping within the constraints of having a fixed number of bytes.

Since these standard-encoding methods define a fixed number of bytes, the range and precision of floating-point numbers are limited. For instance, the single-precision method can never represent more than seven decimal digits; i.e., 23 binary mantissa bits multiplied by Log(2) to convert the 23 base-2 digits to the number of base-10 digits. The "single"-precision floating-point method allocates 8 bits for the exponent, which allows a "signed" binary range from −128 to +127. In decimal, the range becomes approximately −38 to +38, that is, 128*Log(2) is approximately 38. Thus, "single" precision floating-point numbers may not store numbers greater than 1e39. The existing strategies for encoding floating-point numbers are optimized for speed and space considerations, and pack the greatest number of possible numeric combinations in a fixed-number of bytes.

When comparing one floating-point encoded number to another, both encoded numbers must be decoded first before one can be determined to be greater than, equal to, or less than the other. All the bytes of the floating-point numbers must be read into memory and functionally transformed (i.e., decoded) before the comparison can occur.

In modern programming languages, as well as in modern processors, one will find many different methods to encode numbers. For integers, there are 8-bit "bytes", 16-bit "shorts", 32-bit "ints", and 64-bit "longs". All such numbers can be "signed" to include negative numbers, or be "unsigned" to permit only non-negative numbers. In addition, many processors reverse the bytes in the encoding, called "little-endian" or "big-endian" strategies. Floating-point numbers have a variety of categories, such as 32-bit "singles", 64-bit "doubles", and 80-bit "decimals". All such number formats have a string "printable" notation as well. When comparing a number from one encoding scheme to another number from another encoding scheme, the number must typically be converted to the encoding method of the other before the comparison can occur.

The most natural method for comparing two different generic bit structures is the left-to-right bitwise comparison technique. The bit "0" is always less than the bit "1". To compare two bit arrays A and B, the left-most bit of A, denoted as A(0), is compared with the left-most bit of B, denoted as B(0). If A(0)<B(0), then A is less than B. If A(0)>B(0), then A is greater than B. If, however, A(0)=B(0), then the next left-most bit, denoted A(1) and B(1) respectively, is checked. The strategy repeats successively comparing A(i) to B(i) until the pair-wise bit values are found to differ. If, during the loop over the index i, either A or B runs out of bits before a difference is found, then the array that ran out of bits first is "less than" the other by default. In other words, shorter arrays are "less than" longer arrays when all pair-wise bits are found to be equal.

The aforedescribed algorithm for comparing bit arrays is typically hard-coded into modern microprocessors for efficient speed optimization. Unfortunately, the algorithm cannot be used to compare the corresponding byte arrays of most encoded numbers; especially the floating-point numbers. The reason is that the left-most sign (S) bit in popular floating-point encoding methods is "1" for negative numbers and "0" for all others. Negative numbers always come before positive numbers when numerically ordering them, but a logical contradiction occurs because the bit value of "1" comes after the bit value of "0" by numerical convention. It is not sufficient to merely flip the sign bit. For example, the integer 2 is typically coded into a byte as 00000010 using the 2's complement method. The number –2 then becomes 11111110. The bitwise order of these two numbers clearly places 11111110 after 00000010, even though the number –2 is less than the number 2. The problem remains even when constrained to the positive numbers. Consider 256 as the binary value of 00000001 00000000. When compared bitwise to the number 2 as 00000010, the first byte in 256 is less than the first byte in 2.

Instead, modern microprocessors typically include an instruction that compares two 8-byte "double"-precision IEEE 754 floating-point numbers. The instruction must prefetch all 8-bytes of each number before the comparison can be performed. If a 4-byte floating-point comparison instruction does not exist, then a 4-byte "single"-precision IEEE 754 floating-point number must be converted to the 8-byte encoding before the comparison can occur. For common integers, the microprocessor defines other instructions specially tailored to 1-, 2-, 4-, and 8-byte signed and unsigned integer comparisons. No one-size-fits-all single algorithm exists that can compare all these number-encoding formats.

SUMMARY OF THE INVENTION

In one embodiment, the present invention is a computer implemented method of encoding a floating-point number comprising providing a floating-point number, and encoding the floating-point number to a binary string so that a left-to-right comparison of the binary string determines relative magnitude of the floating-point number.

In another embodiment, the present invention is a computer implemented method of encoding a floating-point number comprising providing a floating-point number, and encoding the floating-point number to a binary string having a length as a function of the mantissa and exponent of the floating-point number.

In another embodiment, the present invention is a computer implemented method of encoding a floating-point number comprising providing a floating-point number, and encoding the floating-point number to a binary string, wherein a portion of each byte of the binary string determines whether another byte follows in the binary string.

In another embodiment, the present invention is a computer implemented method of encoding a floating-point number comprising providing a floating-point number, and encoding the floating-point number to a binary string, wherein the encoding process operates with all floating-point numbers.

In another embodiment, the present invention is a computer program product usable with a programmable computer processor having computer readable program code embodied therein, comprising computer readable program code which encodes a floating-point number to a binary string so that a left-to-right comparison of the binary string determines relative magnitude of the floating-point number.

In another embodiment, the present invention is a computer system for encoding a floating-point number comprising means for providing a floating-point number, and means for encoding the floating-point number to a binary string so that a left-to-right comparison of the binary string determines relative magnitude of the floating-point number.

BRIEF DESCRIPTION OF THE DRAWINGS

FIG. 1 illustrates a comparison between floating-point encoding methods;

FIG. 2 illustrates the bit format of the industry-standard floating-point encoding methods;

FIG. 3 illustrates examples of the relationship between floating-point numbers and their corresponding hexadecimal and binary encodings;

FIG. 4 illustrates the bit-format for floating-point numbers in accordance with the present encoding method;

FIG. 7 illustrates the present encoding method's single-byte encodings for floating-point numbers;

FIG. 8 illustrates additional encodings for floating-point numbers; and

FIG. 9 illustrates time and date encodings for floating-point numbers.

DETAILED DESCRIPTION OF THE DRAWINGS

Figure 5:
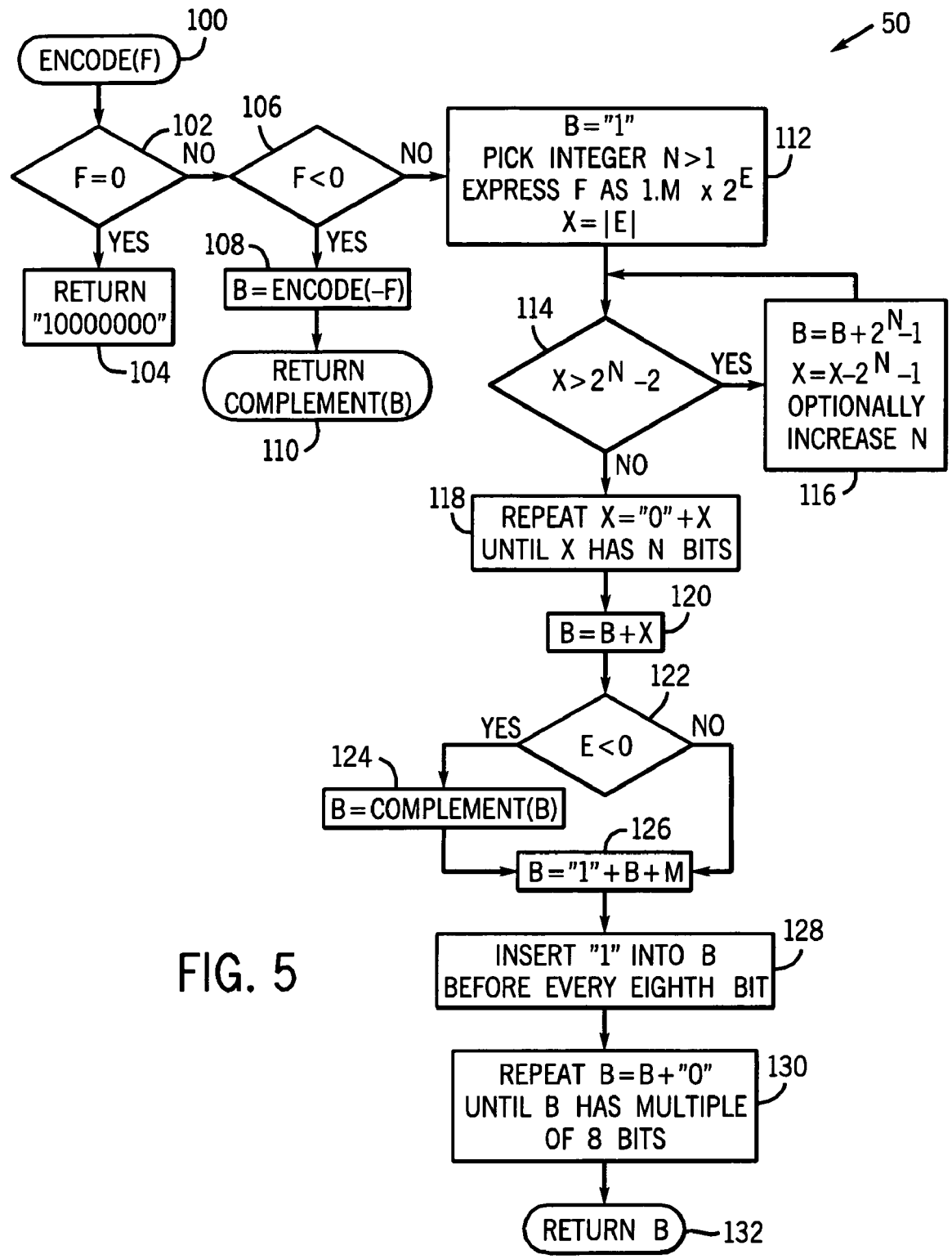
FIG. 5 illustrates the general process of encoding floating-point numbers.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The present invention is a computer-implemented method of encoding and decoding a floating-point number to and from an array of bits such that the natural left-to-right bit-by-bit comparison of two bit arrays map logically and consistently with the natural ordering of their corresponding numerical values. For example, given two arbitrary floating-point numbers F1 and F2, the present invention will map each number one-to-one and onto the bit arrays A1 and A2 respectively such that F1<F2 if and only if A1<A2.

The present floating-point encoding method is particularly useful in storing and manipulating numbers in digital computers. The encoding method is useful in many applications involving storing and computation of floating-point numbers, such as finance, automotive, aviation, and industrial controls, just to name a few. In reality, floating-point numbers are used virtually anywhere digital computers are crunching numbers for any industrial, business, and personal application. The methodology can be performed in software or within the hardware components of many digital computers.

In various aspects, the present invention is a computer implemented method involving encoding a floating-point number to a binary string. A left-to-right comparison of the binary string determines relative magnitude of the floating-point number. The present invention is also a computer implemented method of encoding a floating-point number to a binary string having a length as a function of the mantissa and exponent of the floating-point number. The present invention is also a computer implemented method of encoding the floating-point number to a binary string, wherein a portion of each byte of the binary string determines whether another byte follows in the binary string. The present invention is also a computer implemented method of encoding a floating-point number to a binary string, wherein the encoding process operates with all floating-point numbers.

Alternatively, the present invention can be a method of mapping any floating-point number to and from an array of bits such that the number of bits required to encode the floating-point number may vary and grow to the number of exponent bits needed to encode the number. The present invention can also be viewed as a method of mapping any floating-point number to and from an array of bits such that the number of bits required to encode the floating-point number may vary and grow to the number of mantissa bits needed to encode the number exactly or to any level of approximation accuracy. The present invention can also be viewed as a method of mapping any floating-point number to and from an array of bits such that the number of bits required to encode the floating-point number is less for the more frequently used numbers and more for less frequently used numbers.

As introductory definitions and constraints, assume "bijective mapping" is defined to be a "one-to-one and onto" function. That is, if M is a mapping between set A and set B, then for every a in A there corresponds exactly one b in B, and for every b in B there corresponds exactly one a in A. Thus, sets A and B must have the same number of elements. A "floating-point number" is defined as equivalent to an integer called the "integral", followed by a decimal point, followed by an integer called the "fraction". In other words, a floating-point number is a number in the format: "INTEGRAL.FRACTION". The term "F1<F2" is defined to be a comparison of two arbitrary floating-point numbers F1 and F2 where F1 is said to be less than F2, which is true if and only if (INTEGRAL(F1)<INTEGRAL(F2)) or ((INTEGRAL(F1)=INTEGRAL(F2)) and (FRACTION(F1)<FRACTION(F2))). In other words, if the integral part of F1 is less than the integral part of F2, then F1<F2, and vice versa. If the integral part of F1 is equal to the integral part of F2, but the fraction part of F1 is less than the fraction part of F2, then F1<F2, and vice versa. Define "F1>F2" to be a comparison of two arbitrary floating-point numbers F1 and F2 where F1 is said to be greater than F2, which is true if and only if F2<F1. Define "F1=F2" to be the comparison of two arbitrary floating-point numbers F1 and F2 where F1 is said to be equal to F2, which is true if and only if F1<F2 is false and F1>F2 is false.

Further define a "bit pattern" to be a string consisting of zeros, ones, letters, and spaces. For example, "SZ11EEE1 EEEMMMM0" is a bit pattern. Define the "head of" a bit pattern B to be the left-most bit. Define the "tail of" a bit pattern B to be the bit pattern consisting of all the B with its left-most bit removed. Define the bit "0" to be less than the bit "1". Define "B1<B2" to be a comparison of two arbitrary bit patterns B1 and B2 where B1 is said to be less than B2. This statement is true if: B1 has no bits and B2 has bits; else the head of B1 is less than the head of B2; else the tail of B1 is less than the tail of B2. For any two arbitrary bit patterns B1 and B2, B1=B2 if neither B1<B2 nor B2<B1.

Further define the "complement of a bit B" to be "1" if B is "0" or "0" if B is "1". Define the "complement of a bit pattern" to be the complement of all bits in the pattern. Define "to suffix a bit pattern" as the equivalent of appending the bit pattern; i.e., affixing to the tail (or right-side) of the bit pattern. Suffixing "111" to "000" results in "000111". Define "to prefix a bit pattern" as the equivalent of pre-pending the bit pattern; i.e., affixing to the head (or left-side) of the bit pattern. Prefixing "111" to "000" results in "111000". Define the "S" bit to be the first bit in an encoding, which represents the sign of the entire number. Define the "Z" bit to be the next bit in an encoding, which represents the sign of the exponent. Define an "E" bit to represent an exponent bit. Define an "M" bit to represent a mantissa bit. Define an "X" bit to represent an expansion bit that occurs at every eighth bit denoting whether the next byte is part of the floating-point encoding or not.

One goal is to encode any floating-point number into a bit pattern such that the following constraints hold true. The encoding method is a bijective mapping between the set of all floating-point numbers F and the encoding set, which is a subset of all bit patterns. Every proper encoding bit pattern B corresponds to exactly one floating-point number. Every floating-point number corresponds to exactly one encoding bit pattern. Each unique floating-point number encodes into a unique binary string. For any two arbitrary floating-point numbers F1 and F2 that are encoded into bit patterns B1 and B2 respectively, F1<F2 if and only if B1<B2. In other words, by creating a table of ordered floating-point numbers F1 to Fn mapped to their corresponding bit patterns B1 to Bn, then the bit patterns B1 to Bn will also be ordered.

Turning to the figures, FIG. 1 is a comparison between five known floating-point encoding methods and the encoding method of the present invention. Table 10 shows Single, Double, Extended, Quadruple, and Brookshear encoding methods along with the present novel floating-point encoding method as described in column 12. The row titled "Total bits" shows that the comparison encoding methods use 32, 64, 80, 128, and 8 bits respectively, whereas the present encoding method uses any multiple of 8 bits. Only the present method can vary the number of bits it uses in the encoding process. The row titled "Exponent bits" shows the number of bits reserved to model the exponent. The rows titled "Smallest exponent" and "Largest exponent" calculate the range of the exponent bits. The row titled "Mantissa bits" shows the number of bits reserved to encode the floating-point's mantissa bits; i.e., the significant "precision" bits. The rows titled "Smallest positive value" and "Largest positive value" denote the corresponding range of the entire floating-point number.

The 128-bit (or 16-byte) "quadruple" method does exist but is not typically found in personal or small-business computers. Brookshear's 8-bit floating-point representation is used for demonstrating and teaching floating-point numbers to computer science students. All these comparison methods (excluding the present method) are similar in that the bits have a single sign bit, followed by a fixed number of exponent bits, followed by a fixed number of precision bits. A sign bit of "0" denotes a non-negative number.

Table 20 of FIG. 2 shows how existing encoding methods assign interpretations to bit positions. The first column, titled "Encoding Method", contains the common name for the contemporary floating-point encoding methods used for comparison. The second column, titled "Byte Count", shows how many fixed bytes each encoding method uses. The third column, titled "Bit Format", shows how each bit in each byte is used. The far left bit is the sign (S) bit. The next series of bits are the exponent (E) bits. The remaining right bits are the mantissa (M) bits. Bits are grouped by eight and separated by a space.

Table 30 in FIG. 3 shows how an example byte array is interpreted to represent a floating-point number. Each row represents an example. The first column, titled "Row", merely enumerates the example row. The second column, titled "Hexadecimal Bytes", gives the hexadecimal value for each byte separated by spaces. The header contains "00 01 02 03" to help visually enumerate the bytes below in the data rows. Bytes and bits are enumerated from left-to-right starting with 00. For example, the value of byte 01 of row 3 is "C0". Each byte has two hexadecimal digits. The sixteen hexadecimal digits are "0123456789ABCDEF". Since it takes 4 bits to represent 16 combinations, and since a byte has 8 bits, 2 hexadecimal digits are needed to encode a single byte. The third column, titled "Corresponding Bits", shows the binary equivalent values of the second column. Bits are grouped by eight, separated by spaces. Again, the bit enumeration is shown in the header. For example, bit 11 of row 3 is "1", and bit 12 of row 3 is "0". The fourth column, titled "Corresponding IEEE 754 Numeric Value", shows the equivalent IEEE 754 floating-point interpretation of the bit value encodings.

In FIG. 4, table 40 illustrates the present floating-point encoding method. Note that only the encoding patterns for the first eight bytes are shown. The formula for adding more exponent bits or mantissa bits follow from table 40. The first column, titled "Row", enumerates the example row. The second column, titled "E", denotes the number of exponent (E) bits in the pattern. The third column, titled "M", denotes the number of mantissa (M) bits in the pattern. The fourth column, titled "MAX EXP", denotes the absolute decimal value that the exponent bits can model. The fifth column, titled "DIGITS", denotes the approximate number of significant decimal digits that the pattern can model. The remaining columns, titled "BYTE 0", "BYTE 1", etc., denote the actual bit pattern where each character describes how the corresponding bit is to be interpreted.

The interpretation characters are "S", "Z", "E", "M", "0", and "1". S is for the sign bit where 0 means the floating-point value is negative, and 1 means otherwise. If the sign bit is 0, then all bits following are immediately negated. Z is for the sign of the exponent where 0 means the exponent value is negative, and 1 means otherwise. E is for the actual positive exponent values. If all E bits in a pattern are set to 1, then the pattern is not used, and the pattern in the following row is tried. M is for the actual positive mantissa bits. "0" represents the extension bit value that terminates the pattern. When 0, no following bytes are part of the pattern. "1" represents the extension bit value that continues the pattern. When 1, the next byte is part of the pattern.

Before various encoding examples are given, define the pattern's "Exponent Adjustment" to be a mapping from the number of exponent bits N to an integer. For this implementation, choose N to be a member of the set {2, 6, 12, 28, etc.}. This set is chosen based on processor optimization criteria but can be any set of integers that start with a first element greater than 1 where each successor element increments by steps of 2 or more. The Exponent Adjustment mapping then becomes the relation set {(2,0), (6,3), (12,66), (28,4161), ..., (N, EA)}, where EA is the $2^{\wedge}$ (the previous N)+(the previous EA)−1. For example, the entry (28,4161) was determined to be $2^{\wedge}12+66-1=4096+66-1=4161$.

To encode the floating-point value of 0.00, the bit pattern of "10000000" is used as an axiom. "10000000" means zero without applying the pattern rules above. It is advantageous that such a common and popular value, like zero, should only take one byte of memory to encode, which is not true of other comparison methods. To encode the floating-point binary value of 1.000, the number is converted to binary scientific notation, which yields 1e0. That is, 1 times 10 to the power of 0. To normalize the significant digits, the left most "1" digit is dropped, which yields a mantissa of "0". The exponent is "0". Since the shortest bit pattern needed has 2 exponent bits, subtract the exponent adjustment of "0" from the exponent to get "0" for a pattern having at least one M bit and at least one E bit. The bit pattern of "SZEEMMM0" from row 1 of FIG. 4 is the first pattern that meets these criteria. Plugging in the mantissa of "0" into this pattern is "SZEE0000". Plugging in the exponent of "0" is "SZ000000". Since the exponent is not negative, Z is set to "1", which is "S1000000". Finally, the sign of the entire number is not negative, so S is set to "1", which is "11000000".

Table 40 is useful in explaining the present floating-point number encoding methodology. Let F be a floating-point number. To encode F=−9.5, which is "1001.1" in binary, the number is converted to binary scientific notation, which is 1.0011e11. The significant digits are "10011". After dropping the left-most bit, the normalized mantissa becomes "0011". The exponent bits are "11". The pattern of exponents will not fit in an "SZEEMM..." pattern because then all E bits would be "1"s. This is an exponent marker bit pattern that indicates a following pattern that has more exponent E bits. Since the next size up is a "SZ11EEE1 EEEMM...", which contains 6 E bits, subtract the exponent adjustment of 3 from our current exponent value to yield "0". Since there are 4 mantissa bits to encode, the first pattern from FIG. 4 that can sufficiently model the floating-point number in row 9; i.e., "SZ11EEE1 EEEMMMM0". Plugging in the mantissa bits of "0011" is "SZ11EEE1 EEE00110". Plugging in the exponent bits of "0" is "SZ110001 00000110". The exponent is not negative, so Z is set to "1" to give "S1110001 00000110". But −9.5 is negative, so S is set to "0", which requires that all other bit values be negated to give "00001110 11111001", which is "0E F9" in binary.

Flowchart 50 in FIG. 5 can also be used to encode the same number −9.5. Starting with step 100, i.e. ENCODE(−9.5), since F is not equal to 0 in step 102, move to step 106. Since F is less than 0 in step 106, move to step 108. First ENCODE (−F), which means to ENCODE(9.5), and then complement the bits. Step 108 is really a recursive call to the flowchart. To ENCODE(9.5), start with step 100 again and move past steps 102 and 106 to step 112. Start with B="1". Pick N=2, and express F as 1.0011e11, which gives M="0011" and E="11", and X="11". In step 114, X, which is 3, is greater than 2^N−2, which is 2. So move to step 116. Let B, which is "1", be suffixed with 2^N−1, which is 3; i.e., "11" in binary. B becomes "111". Subtract 2^N−1, which is 3, from X, which is 3. X becomes 0. Finally, optionally increase N, which is 2, by 4. N is now 6. Back to step 114, X, which is 0, is no longer greater than 2^N−2, which is 2^6−2, which is 62. So move to step 118, which left-pads X, which is "0", with "0"s until its length in bits equals N, which is 6. So X becomes "000000". Step 120 appends X, which is "000000" to B, which is "111". So B becomes "111000000".

In step 122, E, which is 3, is not less than zero. So skip to step 126. B is prefixed with "1" and suffixed with M. B becomes "1"+"111000000"+"0011" or "11110000000011". Step 128 inserts the extension bit "1" before every eighth bit. So B becomes "11110001 0000011". Step 130 right-pads B with "0"s to fit on byte groupings; i.e., even multiples of 8-bits. B becomes "11110001 00000110", which is hexadecimal encoding "F1 06" for the bit encoding for 9.5. Step 132 returns to the recursive call of step 108 to step 110 which takes the complement of B to get the encoding for −9.5. The complement of "F1 06" is "0E F9", which is identical to the aforementioned example that used table 40 as shown in FIG. 4.

The patterns of table 40 as shown in FIG. 4 can be extended to accommodate any floating-point number. The pattern in row 22 is "SZ111111 11111111 11111111 EEEEEEE1 EEEEEEE1 EEEEEEE1 EEEEEEE1 MMMMMMM0". It has 28 exponent bits and 7 mantissa bits. If more exponent bits were needed, the method to extend them would be to first replace all existing "E" bits with a "1", and then double the number of "EEEEEEE1" patterns. Doing so would yield "SZ111111 11111111 11111111 11111111 11111111 11111111 11111111 EEEEEEE1 EEEEEEE1 EEEEEEE1 EEEEEEE1 EEEEEEE1 EEEEEEE1 EEEEEEE1 EEEEEEE1 MMMMMMM0", and produce 56 extension bits. If more mantissa bits are needed, merely append one or more "MMMMMMM1" patterns while appropriately modifying the right-most extension bits for each byte. For example, the pattern in row 9 of FIG. 4 is extended by this method to yield rows 10 to 15. For each mantissa "MMMMMMM1" byte appended, approximately 2.1 significant decimal digits are added to the number's precision. Since one bit per byte is allocated as an extension bit, only 7 bits per byte model numeric data. A random number stored in an 8-byte IEEE 754 double-precision floating-point encoding will take 9-bytes of the present encoding method.

In FIG. 5, to encode F=0, use the bit pattern "10000000" having a value of "1" followed by seven "0"s. To encode a negative floating-point number F into a bit pattern B, encode its absolute value to produce the bit pattern B, and then let B=the complement of itself.

Consider the following further examples of encoding a floating-point number 13.75, which has "13" as the integral, and "75" as the fraction. In FIG. 5, since the integral 13 is positive, step 112 starts with B="1". Let N=2, which is an arbitrary number greater than 1. Throughout the algorithm, the number N represents the number of bits allocated to storing the exponent. To express 13.75 in binary form, replace 13 with its binary equivalent of "1101", and replace 0.75 with its binary equivalent of "0.11". The result is "1101.11". Note that "0.1" in binary is equal 0.5 in decimal; "0.01" in binary is equal to 0.25 in decimal (0.5+0.25=0.75). Next, convert "1101.11" to exponential notation; i.e., in the form A*2^B. A is the binary floating-point number called the "significand", which can be one of two values: (1) zero; or (2) greater than or equal to 1 but less than 2. B is the integer exponent. A*2^B is often written as AeB, where "e" is a token that means "exponent". So "1101.11" is written as "1.10111e11" in exponential notation where "1.10111" is the significand and "11" is the exponent, which merely shifts the decimal 3 places (i.e., "11" places) to the left so that only one "1"-digit is to the left of the decimal place. The significand is normalized. Since it shifted 3 places to the left, the exponent is 3 (or "11" in binary). Had the requirement been to shift it to the right, the exponent would be negative. So "1.10111" times 2 to the power of 3, which is 8, would yield the original number of "1101.11". Let X=the absolute value of E, which is 3.

In step 114, the exponent is "11", which is 3, is greater than 2^N−2, which is 2^2−2, which is 2. So go to step 116. Suffix B, which is "1", with "1" repeated N time, which is 2 times. Since N is 2, B is suffixed with "11". B is now "111". Subtract 2^N−1, which is 2^2−1, which is 3, from X, which is "11", which is 3. X is now 0. Optionally increase N by any arbitrary non-negative integer. As per the specification implementation, N is increase by 4 so that N is now 6. Returning to step 114, X is 0, which is not greater than or equal to 2^N−2, which is 62. X, which is "0", is prefixed with "0" until it has N bits, which is 6 bits. X is then "000000".

In step 120, B, which is "111", is suffixed with X, which is "000000". Then B is "111000000". In step 122, E is not less than zero, so go to step 126. The mantissa is all the digits that follow the decimal point in the significand. The significand is "1.10111", so the mantissa is "10111". In this sense, the prefix "1." has been dropped from the significand. With the exception of zero, all normalized significands for numbers will be prefixed with a "1.". Prepend B, which is "111000000", with "1". B is then "1111000000". Suffix B with M, which is "10111". B becomes "111100000010111". In step 128, insert a "1" before every 8th bit. The B becomes "111100010001011111". In step 130, suffix the bit pattern with zero or more "0"s until the number of bits in the pattern is a multiple of eight. In this case, B, which is "111100010000101111", has 17 bits, which is not a multiple of 8. So append 7 "0"s to B to increase its number of bits to 24, which is a multiple of 8. B becomes "11110001 00010111 10000000", which is "F1 17 80" in hexadecimal.

Notice from the above conversion process that the length of the binary string is in part a function of the mantissa and exponent of the floating-point number. The value of the mantissa and the value of the exponent of the floating-point number determines in part the ultimate length of the binary string.

Another feature of the present floating-point to binary conversion process is that each byte of the binary string determines whether another byte follows. The general rule is that if the last bit of each byte is the value of the first bit of the first byte, then another byte follows. Conversely, if the last bit of each byte is not the value of the first bit of the first byte, then no further byte follows. For a positive number, if the byte ends in a "1", then another byte of the binary string will follow. If the byte ends in a "0", then no further byte follows. For example, in the binary string "11110001 00010111 10000000" from the floating-point number 13.75, the first byte ends in a "1", so another byte follow. The second byte ends in a "1", so another byte follows. The third byte ends in a "0", no further bytes follow. This feature allows computation algorithms to determine the end of the binary string.

Consider another example of encoding the floating-point number −13.75, which has "13" as the integral, and "75" as the fraction. To encode −13.75, encode its positive value, which is 13.75, and then negate the resulting bit pattern. B then becomes "00001110 11101000 01111111", which is "0E E8 7F" in hexadecimal.

Consider yet another abridged example of encoding the floating-point number −25.1. Encoding −25.1 is the same as complementing the encoding of 25.1. From step 112, start with B="1" and N=2. 25.1 is "11001.0001100" in binary, wherein the ending pattern "1100" repeats indefinitely. Therefore, the number of mantissa bits to truncate this bit pattern must be decided externally before encoding it. If the goal is to keep the same precision as the 8-byte IEEE 754 double precision encoding, then according to FIG. 1, 53 mantissa bits are required. The binary value must be expanded to "11001.000 1100 1100 1100 1100 1100 1100 1100 1100 1100 1100 1100 11". The exponential form is "1.1001000 1100 1100 1100 1100 1100 1100 1100 1100 1100 1100 1100 11e100". Therefore, the mantissa is "1001000 1100 1100 1100 1100 1100 1100 1100 1100 1100 1100 1100 11" and the exponent is "100". So X is "100". From step 116, suffix "11" to B so that B is "111"; subtract 3 from X to get "1"; increase N from 2 to 6; and go to step 114. In step 118, X is padded to get "000001" and B becomes "111000001". Step 126 gives B="1111000 0011001 0001100 1100110 0110011 0011001 1001100 1100110 0110011" where the bits are space-delimited into groups of 7 bits for visual convenience. Step 128 adds the eighth bit of "1" to every grouping of seven bits. "11110001 00110011 00011001 11001101 01100111 00110011 10011001 11001101 0110011". In step 130, B has only 71 bits, yet 72 is the next even multiple of 8. So append a "0" to B to make B's bits group into bytes of 8 bits. B becomes "11110001 00110011 00011001 11001101 01100111 00110011 10011001 11001101 01100110", which is the encoding of 25.1. To get the encoding of −25.1, complement B. B becomes "00001110 11001100 11100110 00110010 10011000 11001100 01100110 00110010 10011001", which is equivalent to "0E CC E6 32 98 CC 66 32 99".

In a more abridged example of encoding the number 1000="1111101000"="1.111101000e1001", the exponent=1001 and the mantissa=111101000. According to step 114, the exponent is too big to fit. So suffix "11" to B, subtract 3 from exponent, which becomes "110", and append it padded to 6 characters. B becomes "111000110". In step 120, B becomes to get "1111000 1101111 01000". Insert a "1" before every eighth bit, and append "0" to pad the remaining bits in the byte. B becomes "11110001 11011111 01000000", which is "F1 DF 40".

In an example of encoding the number 4,294,967,296= 2^32="100000000000000000000000000000000"="1e1000 00", the exponent gets adjusted to "11101" by subtracting 3. The mantissa is "0". The bit pattern becomes "11" for the "S" and "Z" bits, followed by "11" for the exponent adjustment, followed by "011101" for the E bits, followed by "0" for the mantissa to become "11110111010". Insert the X bits results in "11110111 1010000" or "F7 A0".

In an example of encoding the number 18,446,744, 073, 709,551,616=2^64="1" followed by 64 "0"s="1e1000000". The exponent of our number is "1000000", which takes seven bits. So the exponent adjustment is 3, which is subtracted from "1000000" to give "111101", which now will fit in the six "E" bits. So the bit pattern becomes "11" for the "S" and "Z" bits, "11" for the exponent adjustment, "111101" for the "E" bits, and "0" for the mantissa, which results in "1111111101". After adding the "X" bits, the final encoding is "11111111 10100000", which is "FF A0". Again, a very large but useful number like 2^64 takes only 2 bytes to encode.

To show an example using step 124 of flowchart 50 of FIG. 5, encode a number with a negative exponent. For example, F=0.0625, which is 1.0e−4 in binary. Start with 1, and then divide it by 2 to get 0.5. Divide again by 2 to get 0.25, and again to get 0.125, and once more to get 0.0625. Since the number has been divided four times, the exponent is −4. Thus, B="1", M="0" and E 32 −4, and X is "100". By step 120, B is "111000001". In step 122, E is less than zero so go to step 124. Complement B to get "000111110". In step 126, B is transformed into "1"+"000111110"+"0" to get "10001111100". Step 128 transforms B into "1000 1111 1100". Step 130 transforms B into "1000 1111 1100 0000", which is "80 C0" in hexadecimal.

While several examples have been given, an important point to notice is that the present process of encoding a floating-point number to a binary string works with all floating-point numbers. This property is not available with other prior art encoding techniques, which either limit the range of the exponent, or limit the range of the mantissa, as shown in FIG. 1. For example, the arbitrary-precision Java.Math.BigDecimal class limits its scaling value to 32-bits, and the GNU Multiple Precision (GMP) library requires all bytes of a number to exist in memory simultaneously. With the present process of encoding a floating-point number to a binary string, a number can be processed as a buffered stream one byte at a time effectively discarding the byte after it has been consumed.

Another property of the present encoding method is that a left-to-right comparison of the binary string determines relative magnitude of the floating-point number. For example, the floating-point number 13.75 encodes to "11110001 00010111 10000000". The floating-point number 1000 encodes to "11110001 11011111 01000000". Doing a left-to-right comparison yields the same values for the first eight bits, but the first bit of the second byte is "1" for the floating-point number 1000 and "0" for the floating-point number 13.75. Therefore, 1000 is greater than 13.75. In another example, the floating-point number −25.1 truncated to 52 significant bits of mantissa encodes to "00001110 11001100 11100110 00110010 10011000 11001100 01100110 00110010 10011001" and the floating-point number −13.75 encodes to "00001110 11101000 01111111". A left-to-right comparison yields the same values for the first eleven bits of each encoding, but the twelfth bit is "1" for −13.75 and "0" for −25.1. Since "1" is greater than "0", −13.75 is greater than −25.1. Accordingly, a left-to-right comparison of the binary string determines relative magnitude of the floating-point number. If the binary strings are identical for their common portion, but one string is longer than the other, then the longer string corresponds to the larger floating-point number, which can be deduced from the encoding method. Since the eighth bit of all encoded bytes is an extension bit, then, for example, if one encoding takes two bytes and a second encoding takes three bytes, the 16th bit of each encoding will differ since every 8th bit is an extension flag that determines whether it is the last byte in the encoding or not. If the two encodings' first 15 bits are identical, then the encoding that has a "0" for the 16th bit will be the smaller number.

Figure 6:
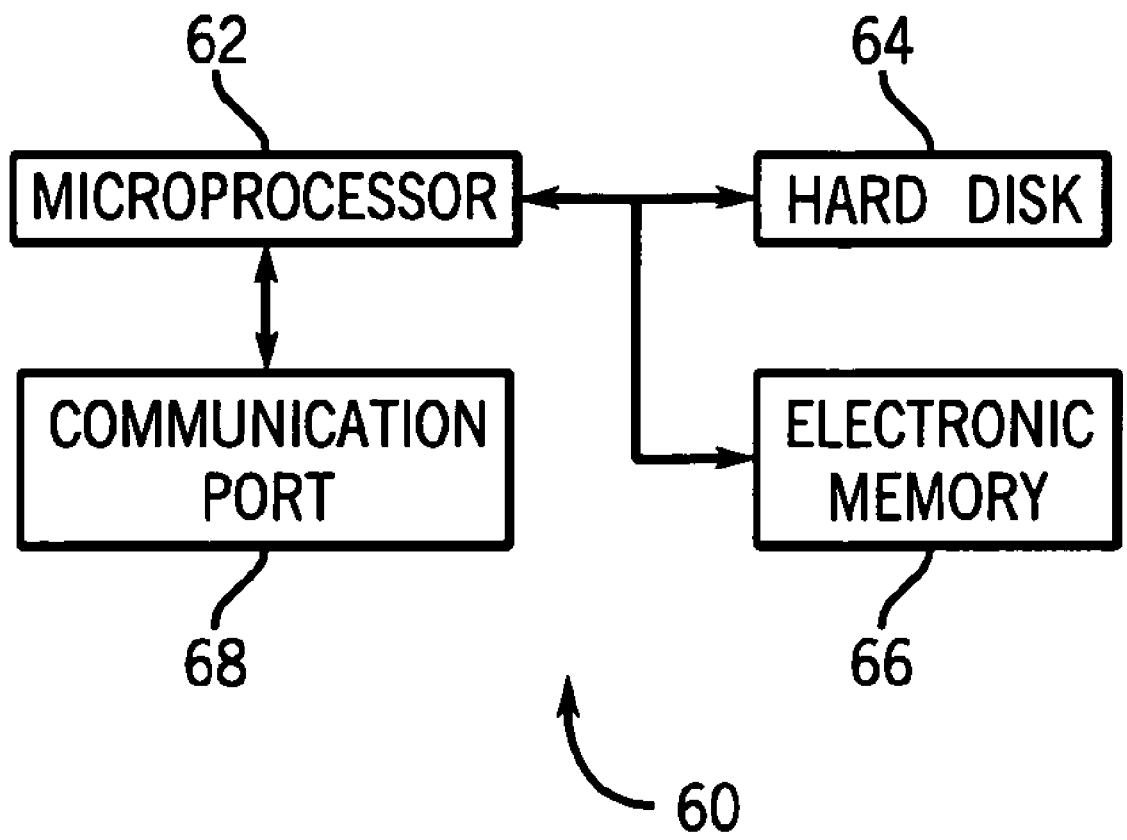
FIG. 6 illustrates a general purpose computer for executing the method of encoding floating-point numbers.

In FIG. 6, a simplified view of a general purpose digital computer 60 for executing the present encoding method. Computer 60 has a central processing unit or microprocessor 62, mass storage device or hard disk 64, electronic memory 66, and communication port 68. In one embodiment, computer system 60 contains the hardware components, application software, or computer programs used to perform the present encoding methodology. The software is originally provided on computer readable media, such as compact disks (CDs), or downloaded from a vendor website, and installed on the desired computer.

Table 70 of FIG. 7 shows proper bit value combinations for floating-point numbers that can be encoded into a single byte. The columns titled "BINARY" show the legal bit values. The columns titled "DECIMAL" show the corresponding floating-point numeric value of the cell immediately to its left. Of the 256 possible 8-bit permutations, only 81 have floating-point values for the present encoding method. Only these values are shown in table 50. Packing as many bit permutations as possible into a fixed space is not a priority of the present encoding method. The number of bytes needed may grow to accommodate any floating-point value.

These 81 values only take only one byte to store instead of 4 or 8 as per the IEEE 754 encoding standard. These 81 values arguably comprise more than 99.99 percent of all presently used numeric values. For example, although the number 8 does not appear in the 8-bit encoding pattern, the numbers 0 to 7 do. When modeling the number of children in a typical family, the numbers 0 to 7 are far more than eight-times as frequently used than the number 8 is. In addition, the positive and negative integers from 8 up to 32 only take two bytes to encode, which is still less bytes than the IEEE 754 standard. In addition, the present single-byte encoding also models useful popular numbers such as 0.25, 0.5, 0.75, as well as other popular integer fractions whose denominator is up to 32.

Notice that the bitwise negation of any negative value equals its positive value. For example, −2.25 is encoded as 00101101. Negating these bit values gives 11010010, which maps directly to the +2.25 value. Finally, notice that the 81 number values are ordered from −7.5 to 7.5, and that the bit encodings are also ordered from 00010001 to 11101110, which is a deliberate design constraint of the present encoding method. The order of the bit value encodings must match the corresponding order of the numeric value, and vice versa, which is the most important design constraint.

Table 80 in FIG. 8 shows example relationships between a floating-point number and its encodings as per the present encoding method. Notice again that the binary representation of 1024 is the bit-by-bit negation of the binary representation of −1024. The relationship is true for all numbers and their negatives.

In FIG. 9, the present encoding method can be used to store dates and times to any degree of accuracy and to any date. In table 90, the international Julian Date and Time Standard maps directly to floating-point numbers, where the number represents the number of days since "1 January—4713". The fractional part represents the part of the day that has elapsed since 12:00 noon. Simple dates typically take about 5 bytes to store, but some can take less. For instance, "5 Nov. 1843" takes only two bytes. If the year is unimportant, then each of the 365 days can be encoded as 1 or 2 bytes. Common times, such as 6:00 PM and 9:00 AM take only one byte to store.

While one or more embodiments of the present invention have been illustrated in detail, the skilled artisan will appreciate that modifications and adaptations to those embodiments may be made without departing from the scope of the present invention as set forth in the following claims.

What is claimed is:

1. A computer implemented method of encoding a floating-point number, comprising:
   providing a floating-point number;
   encoding the floating-point number to a binary string having a variable length as a function of the mantissa and exponent of the floating-point number, the variable length of the binary string providing extended precision of the encoded floating point number;
   encoding an absolute value of the floating-point number if the floating-point number is negative; and
   complementing the binary string conversion of the floating-point number.

2. A computer implemented method of encoding a floating-point number, comprising:
   providing a floating-point number;
   encoding the floating-point number to a binary string having a variable length as a function of the mantissa and exponent of the floating-point number, the variable length of the binary string providing extended precision of the encoded floating point number; and
   assigning a value for the binary string if the floating-point number is zero.

3. The computer implemented method of claim 2, wherein the value is a "1" followed by a plurality of "0"s.

4. The computer implemented method of claim 2, wherein each unique floating-point number encodes into a unique binary string.

5. The computer implemented method of claim 2, wherein a portion of each byte of the binary string determines whether another byte follows in the binary string.

6. The computer implemented method of claim 2, wherein each unique floating-point number encodes into a unique binary string.

7. A computer implemented method of encoding a floating-point number, comprising:
   providing a floating-point number;
   encoding the floating-point number to a binary string having a variable length as a function of the mantissa and exponent of the floating-point number;
   encoding an absolute value of the floating-point number if the floating-point number is negative; and
   complementing the binary string conversion of the floating-point number.

8. A computer implemented method of encoding a floating-point number, comprising:
   providing a floating-point number;
   encoding the floating-point number to a binary string having a variable length as a function of the mantissa and exponent of the floating-point number; and
   assigning a value for the binary string if the floating-point number is zero, wherein the value is a "1" followed by a plurality of "0"s.

9. A computer implemented method of encoding a floating-point number, comprising:
   providing a floating-point number;
   encoding the floating-point number to a binary string having a variable length as a function of the mantissa and exponent of the floating-point number; and
   assigning a value for the binary string if the floating-point number is zero, wherein each unique floating-point number encodes into a unique binary string.

10. The computer implemented method of claim 9, wherein the floating-point number represents temporal data.

11. A computer implemented method of encoding a floating-point number, comprising:
   providing a floating-point number;
   encoding the floating-point number to a binary string having a variable length as a function of the mantissa and exponent of the floating-point number; and
   assigning a value for the binary string if the floating-point number is zero, wherein a portion of each byte of the binary string determines whether another byte follows in the binary string.

* * * * *